United States Patent

Rathsack

(10) Patent No.: US 9,209,014 B2
(45) Date of Patent: *Dec. 8, 2015

(54) MULTI-STEP BAKE APPARATUS AND METHOD FOR DIRECTED SELF-ASSEMBLY LITHOGRAPHY CONTROL

(71) Applicant: Tokyo Electron Limited, Tokyo (JP)

(72) Inventor: Benjamen M. Rathsack, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/202,689

(22) Filed: Mar. 10, 2014

(65) Prior Publication Data

US 2014/0273523 A1  Sep. 18, 2014

Related U.S. Application Data

(60) Provisional application No. 61/793,204, filed on Mar. 15, 2013.

(51) Int. Cl.
*H01L 21/02* (2006.01)
*H01L 21/027* (2006.01)
(Continued)

(52) U.S. Cl.
CPC ........... *H01L 21/02269* (2013.01); *B82Y 10/00* (2013.01); *B82Y 40/00* (2013.01); *G03F 7/0002* (2013.01); *G03F 7/40* (2013.01); *H01L 21/0271* (2013.01); *H01L 21/0337* (2013.01)

(58) Field of Classification Search
CPC ........... H01L 21/0337; H01L 51/0028; H01L 51/0043; H01L 21/0271; H01L 21/02269;
C08L 53/00; C08F 297/00; C08F 297/026; C08F 293/00; G03F 7/0002; G03F 7/40
USPC ................... 438/725, 781, 947; 427/379, 377
See application file for complete search history.

(56) References Cited

U.S. PATENT DOCUMENTS

| 5,344,742 A | 9/1994 | Sinta et al. |
| 5,650,261 A | 7/1997 | Winkle |

(Continued)

FOREIGN PATENT DOCUMENTS

| CN | 101681812 A | 3/2010 |
| DE | 102012105384 A1 | 9/2012 |

(Continued)

OTHER PUBLICATIONS

Chi-Chun Liu et al., Integration of Block Copolymer Directed Assembly with 193 Immersion Lithography, American Vacuum Society, J.Vac. Sci. Technol. B 28(6), Nov./Dec. 2010, 5 pages.

(Continued)

*Primary Examiner* — Michael Trinh
(74) *Attorney, Agent, or Firm* — Wood, Herron & Evans, LLP

(57) ABSTRACT

A method of forming a patterned substrate includes casting a layer of a block copolymer having an intrinsic glass transition temperature $T_g$, on a substrate to form a layered substrate. The method also includes heating the layered substrate at an annealing temperature, which is greater than about 50° C. above the intrinsic glass transition temperature $T_g$ of the block copolymer, in a first atmosphere. The method further includes thermally quenching the layered substrate to a quenching temperature lower than the intrinsic glass transition temperature $T_g$, at a rate of greater than about 50° C./minute in a second atmosphere. The method further includes controlling an oxygen content in the first and second atmospheres to a level equal to or less than about 50 ppm to maintain the annealing and quenching temperatures below a thermal degradation temperature $T_d$ of the block copolymer.

20 Claims, 4 Drawing Sheets

(51) Int. Cl.
  *H01L 21/033* (2006.01)
  *G03F 7/40* (2006.01)
  *G03F 7/00* (2006.01)
  *B82Y 10/00* (2011.01)
  *B82Y 40/00* (2011.01)

(56) References Cited

U.S. PATENT DOCUMENTS

| | | | |
|---|---|---|---|
| 6,303,477 | B1 | 10/2001 | Ianovitch |
| 6,413,317 | B1 * | 7/2002 | Miyazaki et al. ............. 118/620 |
| 6,855,476 | B2 | 2/2005 | Ferreira et al. |
| 7,521,094 | B1 | 4/2009 | Cheng et al. |
| 7,579,278 | B2 | 8/2009 | Sandhu |
| 7,687,220 | B2 | 3/2010 | Yamato et al. |
| 7,723,009 | B2 | 5/2010 | Sandhu et al. |
| 7,754,518 | B2 | 7/2010 | Koelmel et al. |
| 7,923,373 | B2 | 4/2011 | Sandhu |
| 8,039,196 | B2 | 10/2011 | Kim et al. |
| 8,083,953 | B2 | 12/2011 | Millward et al. |
| 8,241,822 | B2 | 8/2012 | Yamato et al. |
| 8,420,304 | B2 | 4/2013 | Inatomi |
| 8,603,867 | B2 | 12/2013 | Kim et al. |
| 2002/0192619 | A1 | 12/2002 | Besek |
| 2002/0193619 | A1 | 12/2002 | Crivello et al. |
| 2003/0084925 | A1 | 5/2003 | Nakajima et al. |
| 2005/0056219 | A1 | 3/2005 | Dip et al. |
| 2005/0215713 | A1 | 9/2005 | Hessell et al. |
| 2006/0123658 | A1 | 6/2006 | Izumi |
| 2006/0251989 | A1 | 11/2006 | Breyta et al. |
| 2007/0037412 | A1 | 2/2007 | Dip et al. |
| 2007/0224823 | A1 | 9/2007 | Sandhu |
| 2007/0237697 | A1 | 10/2007 | Clark |
| 2007/0238028 | A1 | 10/2007 | Inatomi |
| 2008/0193658 | A1 | 8/2008 | Millward |
| 2008/0311402 | A1 | 12/2008 | Jung et al. |
| 2008/0318005 | A1 | 12/2008 | Millward |
| 2009/0081827 | A1 | 3/2009 | Yang et al. |
| 2009/0087664 | A1 | 4/2009 | Nealey et al. |
| 2009/0181171 | A1 | 7/2009 | Cheng et al. |
| 2009/0200646 | A1 | 8/2009 | Millward et al. |
| 2009/0236309 | A1 | 9/2009 | Millward et al. |
| 2009/0291398 | A1 | 11/2009 | Horiuchi |
| 2010/0055621 | A1 | 3/2010 | Hatakeyama et al. |
| 2010/0227276 | A1 | 9/2010 | Mizuno |
| 2011/0033786 | A1 | 2/2011 | Sandhu |
| 2011/0059299 | A1 | 3/2011 | Kim et al. |
| 2011/0147984 | A1 | 6/2011 | Cheng et al. |
| 2011/0147985 | A1 | 6/2011 | Cheng et al. |
| 2011/0229120 | A1 | 9/2011 | Takaki et al. |
| 2011/0272381 | A1 * | 11/2011 | Millward et al. ............... 216/37 |
| 2012/0046415 | A1 | 2/2012 | Millward et al. |
| 2012/0046421 | A1 | 2/2012 | Darling et al. |
| 2012/0077127 | A1 * | 3/2012 | Sills et al. .................... 430/311 |
| 2012/0088192 | A1 | 4/2012 | Trefonas et al. |
| 2012/0135146 | A1 * | 5/2012 | Cheng et al. .................. 427/271 |
| 2013/0189504 | A1 | 7/2013 | Nealey et al. |
| 2013/0209694 | A1 * | 8/2013 | Chang et al. .................. 427/379 |
| 2014/0061154 | A1 | 3/2014 | Kim et al. |
| 2014/0099583 | A1 | 4/2014 | Holmes et al. |
| 2014/0154630 | A1 | 6/2014 | Schmid et al. |

FOREIGN PATENT DOCUMENTS

| | | |
|---|---|---|
| KR | 20120133272 A | 12/2012 |
| WO | 03016209 A1 | 2/2003 |
| WO | 2008150673 A1 | 12/2008 |
| WO | 2012071330 A1 | 5/2012 |
| WO | 2012084558 A1 | 6/2012 |
| WO | 2012175342 A2 | 12/2012 |
| WO | 2012175343 A1 | 12/2012 |
| WO | 2013010730 A1 | 1/2013 |

OTHER PUBLICATIONS

Jing Cheng et al., Developing Directly Photodefinable Substrate Guiding Layers for Block Copolymer Directed Self-Assembly (DSA) Patterning, Advances in Resist Materials and Processing Technology, Proc. of SPIE, vol. 7972, 13 pages, 2011.

Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng et al., "Simple and Versatile Methods to Integrate Directed Self-Assembly with Optical Lithography Using a Polarity-Switched Photoresist," ACS Nano, 4(8):4815-4823, 2010.

Cheng, et al., "EUVL Compatible, LER Solutions using Functional Block Copolymers," Alternative Lithographic Technologies IV, Proc. of SPIE, vol. 8323, 2012, 11 pp.

Cho et al., "Polymer Bound Photobase Generators and Photoacid Generators for Pitch Division Lithography," Proc. of SPIE. 7972:797221(1)-797221(8), 2011.

Cupta, "Photoacid Generators for Catalytic Decomposition of Polycarbonate," Thesis for Master of Science, Georgia Institute of Technology, 2006, 137 pp.

Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).

Maki et al., "Photocleavable Molecule for Laser Desorption Ionization Mass Spectrometry," J. Org. Chem. 72:6427-6433, 2007.

Padmanaban et al., "Application of Photodecomposable Base Concept to 193 nm Resists," Proc. of SPIE. 3999:1136-1146, 2000.

Ross et al., "Si-containing block copolymers for self-assembled nanolithography," J. Vac. Sci. Technol. B. 26 (6):2489-2494, 2008.

Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.

Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.

Ruebner et al., "A cyclodextrin dimer with a photocleavable linker as a possible carrier for the photosensitizer in photodynamic tumor therapy," PNAS. 96(26):14692-14693, 1999.

Skulski, "Organic Iodine(I, III, and V) Chemistry: 10 Years of Development at the Medical University of Warsaw, Poland," Molecules. 5:1331-1371, 2000.

Weissman et al., "Recent advances in ether dealkylation," Tetrahedron. 61:7833-7863, 2005.

Gotrik et al., "Morphology Control in Block Copolymer Films Using Mixed Solvent Vapors," ACS Nano, 6 (9):8052-8059, 2012.

Hammersky et al., "Self-Diffusion of a Polystyrene-Polyisoprene Block Copolymer," Journal of Polymer Science: Part B: Polymer Physics. 34:2899-2909, 1996.

Jung et al., "Orientation-Controlled Self-Assembled Nanolithography Using a Polystyrene-Polydimethylsiloxane Block Copolymer," Nano Lett. 7(7):2046-2050, 2007.

Jung et al., "A Path to Ultranarrow Patterns Using Self-Assembled Lithography," Nano Lett. 10:1000-1005, 2010.

Postnikov et al., "Study of resolution limits due to intrinsic bias in chemically amplified photoresists," J. Vac. Sci. Technol. B. 17(6):3335-3338, 1999.

Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.

International Searching Authority, International Search Report and Written Opinion issued in corresponding International Application No. PCT/US13/40815, mailed Oct. 21, 2013, 15 pp.

Choi et al., "Square Arrays of Holes and Dots Patterned from a Linear ABC Triblock Terpolymer," ACS Nano, 6 (9):8342-8348, 2012.

Foubert et al., "Impact of post-litho LWR smoothing processes on the post-etch patterning result," Proc. of SPIE, 7972:797213(1)-797213(10), 2011.

Tavakkoli K.G. et al., "Templating Three-Dimensional Self-Assembled Structures in Bilayer Block Copolymer Films," Science, 336:1294-1298, 2012.

(56) References Cited

OTHER PUBLICATIONS

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages, 2006.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

International Searching Authority, Search Report and Written Opinion issued in corresponding International Application No. PCT/US2014/016766 dated May 26, 2014, 11 pages.

International Searching Authority, Search Report and Written Opinion issued in corresponding International Application No. PCT/US2014/016776 dated May 30, 2014, 12 pages.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene-poly(4-vinylpyridine) in deoxycholic acid melt", Polymer, Elsevier Science Publishers B.V, GB, vol. 52, No. 18, Jul. 13, 2011, pp. 3994-4000.

International Searching Authority, Search Report and Written Opinion issued in corresponding International Application No. PCT/US2014/026969 dated Jul. 16, 2014, 15 pages.

International Searching Authority, Search Report and Written Opinion issued in corresponding International Application No. PCT/US2014/027016 dated Jul. 23, 2014, 11 pages.

International Searching Authority, Search Report and Written Opinion issued in corresponding International Application No. PCT/US2014/023926 dated Jul. 25, 2014, 10 pages.

International Searching Authority, Search Report and Written Opinion issued in corresponding International Application No. PCT/US2014/016760 dated Nov. 6, 2014, 11 pages.

Taiwan Patent Office, Examination Opinion issued in related TW Application No. 102117111, issued May 21, 2015, 17 pp.

Taiwan Intellectual Property Office, Notification of Examination Opinion issued in related Taiwan Application No. 103136203 dated Aug. 31, 2015, 11 pp., including English translation.

* cited by examiner

MULTI-STEP BAKE APPARATUS AND METHOD FOR DIRECTED SELF-ASSEMBLY LITHOGRAPHY CONTROL

CROSS-REFERENCE TO RELATED APPLICATIONS

Pursuant to 37 C.F.R. §1.78(a)(4), this application claims the benefit of and priority to prior filed co-pending Provisional Application Ser. No. 61/793,204, filed Mar. 15, 2013, which is expressly incorporated herein by reference in its entirety.

FIELD OF THE INVENTION

The present invention relates generally to methods of fabricating semiconductor devices and, more specifically, to methods of fabricating semiconductor devices using directed self-assembly processes.

BACKGROUND OF THE INVENTION

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Design rules define the space tolerance between devices or interconnect lines so as to ensure that the devices or lines do not interact with one another in any unwanted manner. One important layout design rule that tends to determine the overall size and density of the semiconductor device is a critical dimension (CD). A critical dimension of a circuit is defined as the smallest width of a feature, e.g., a line or the smallest space between two lines. Another critical design rule is minimum pitch, which is defined as the minimum width of a given feature plus the distance to the adjacent feature edge.

The continual reduction in CDs places increasing demands on the techniques used to form the features. For example, photolithography is commonly used to pattern these features. Typically, photolithography involves passing radiation (light) through a reticle and focusing the radiation onto a radiation sensitive photoresist material. By directing radiation through the reticle, the pattern in the reticle may be focused on the photoresist. The radiation causes a chemical change in the illuminated parts of the photoresist, which allows those illuminated parts to be selectively retained or removed, depending upon whether positive or negative photoresist is used, relative to parts which were non-illuminated. Thus, the exposed (illuminated) and unexposed (non-illuminated) parts form a pattern in the photoresist.

Because photolithography is typically accomplished by projecting radiation onto a surface, the ultimate resolution of a particular lithography technique depends upon factors such as the optical proximity effects and the wavelength of the radiation used. Optical proximity effects are known to result from optical diffraction in the projection system. The diffraction causes adjacent features to interact with one another in such a way as to produce pattern-dependent variations. Accordingly, the closer together features are, the more proximity effect is seen. Thus, the ability to locate line patterns close together encroaches on optical parameter limitations.

One proposed solution for achieving critical dimensions and pitches beyond those currently achievable by photolithography techniques alone is utilizing directed self-assembly (DSA) lithography, which exploits the propensity of certain block copolymers to self-assemble into ordered morphologies, having spherical, cylindrical, lamellar, or bicontinuous gyroid microdomains. However, one challenge for incorporating DSA lithography into mass production is increased processing time caused by long annealing times required for a block copolymer to self-assemble into suitable CD targetry and uniformity.

Accordingly, new and improved methods of patterning semiconductor devices using DSA lithography are needed.

SUMMARY OF THE INVENTION

Embodiments of the invention provide a method of forming a patterned substrate, the method including casting a layer of a block copolymer, having an intrinsic glass transition temperature $T_g$, on a substrate to form a layered substrate. The method also includes heating the layered substrate at an annealing temperature, which is greater than about 50° C. above the intrinsic glass transition temperature $T_g$ of the block copolymer, in a first atmosphere for a first time period. The method further includes thermally quenching the layered substrate to a quenching temperature, which is lower than the intrinsic glass transition temperature $T_g$, at a rate of greater than about 50° C./minute in a second atmosphere. The method further includes controlling an oxygen content in the first and second atmospheres to a level equal to or below about 50 ppm to maintain the annealing temperature and the quenching temperature less than a thermal degradation temperature $T_d$ of the block copolymer.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF THE DRAWINGS

Figure 1A:
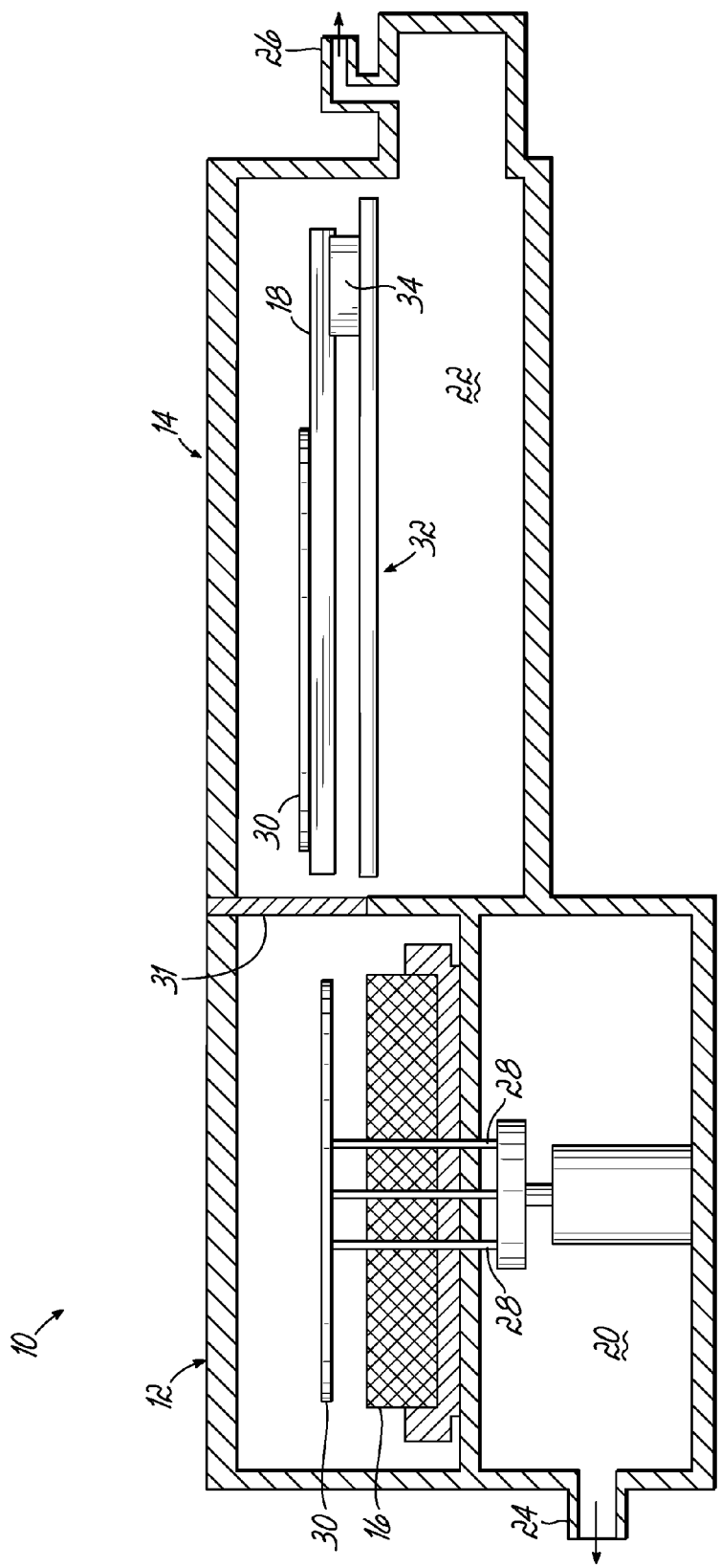
FIGS. 1A and 1B are diagrammatic views of a processing system suitable for methods in accordance with embodiments of the present invention.

Methods for forming a patterned substrate are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

In accordance with embodiments of the present invention, the method of forming a patterned substrate is provided by utilizing a combination of a rapid annealing process and a thermal quench, which rapidly reduces the kinetics of block copolymer microphase separation to provide improved critical dimension control and reduce defects at the end of the annealing process. The method includes casting a layer of a block copolymer on a substrate; heating the layered substrate in a first environment at an annealing temperature for a first time period; and thermally quenching the layered substrate. In accordance with another embodiment, the method further includes controlling an oxygen content in the first and second atmospheres to a level equal to or below about 50 ppm to minimize the thermal degradation of the block copolymer under the annealing conditions and/or the quenching conditions.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger polymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N>10.5$) for those blocks to phase separate. A wide variety of block polymers are contemplated herein including diblock copolymers (i.e., polymers including two polymer blocks (AB)), triblock copolymers (i.e., polymers including three polymer blocks (ABA or ABC)), multiblock copolymers (i.e., polymers including more than three polymer blocks (ABCD, etc.)), and combinations thereof. As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The terms "microphase segregation" and "microphase separation," as used herein mean and include the properties by which homogeneous blocks of a block copolymer aggregate mutually, and heterogeneous blocks separate into distinct domains. In the bulk, block copolymers can self assemble into ordered morphologies, having spherical, cylindrical, lamellar, or bicontinuous gyroid microdomains, where the molecular weight of the block copolymer dictates the sizes of the microdomains formed. The domain size or pitch period ($L_O$) of the self-assembled block copolymer morphology may be used as a basis for designing critical dimensions of the patterned structure. Similarly, the structure period ($L_S$), which is the dimension of the feature remaining after selectively etching away one of the polymer blocks of the block copolymer, may be used as a basis for designing critical dimensions of the patterned structure.

The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal" as used herein means and includes thermal treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by one or more treatments to various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or laser-assisted annealing. As a specific example, one treatment may comprise thermal annealing of the block copolymer that may be conducted by exposing the block copolymer to an elevated temperature that is about 50° C. or more above the intrinsic glass transition temperature ($T_g$), but below the thermal degradation temperature ($T_d$) of the block copolymer, as described in greater detail hereinafter. Other conventional annealing methods not described herein may also be utilized.

As used herein, "intrinsic glass transition temperature" means the glass transition temperature of the block copolymer without the influence of water or other solvents. As known in the art, the presence of solvents lowers the temperature of the glassy transition of the solvent-containing mixtures.

As used herein, "thermal degradation temperature" means a temperature at which the block copolymer will undergo oxidative degradation under ambient oxygen levels. According to embodiments of the present invention, the oxygen content in the surrounding atmospheres for the annealing process and the thermal quench are at a level equal to or less than about 50 ppm. The thermal degradation temperature of a given block copolymer at the desired ambient oxygen level can be ascertained by common methods, which includes but is not limited to, thermogravimetric analysis (TGA).

Turning now to the figures, and in particular to FIG. 1A, a processing system 10 suitable for use with embodiments of the present invention is shown. Generally, the system 10 includes a heating chamber 12 and a cooling chamber 14, each having a wafer support 16, 18 therein, configured to support and heat or cool a wafer 30 positioned thereon. The wafer support 16 also referred to as a heating plate 16, and wafer support 18 is also referred to as a chilling plate. As used herein, the wafer 30 may refer to any structure providing a "substrate" in the fabrication of one or more semiconductor devices. Each of the heating and cooling chambers 12, 14 includes an exhaust chamber 20, 22 that is fluidically-coupled to a vacuum pump (not shown) via an exhaust port 24, 26. As shown, the heating and cooling chamber may be physically isolated from one another by a movable door 31 that is operationally coupled with the operation of a transfer mechanism 32, as discussed below.

Figure 1B:
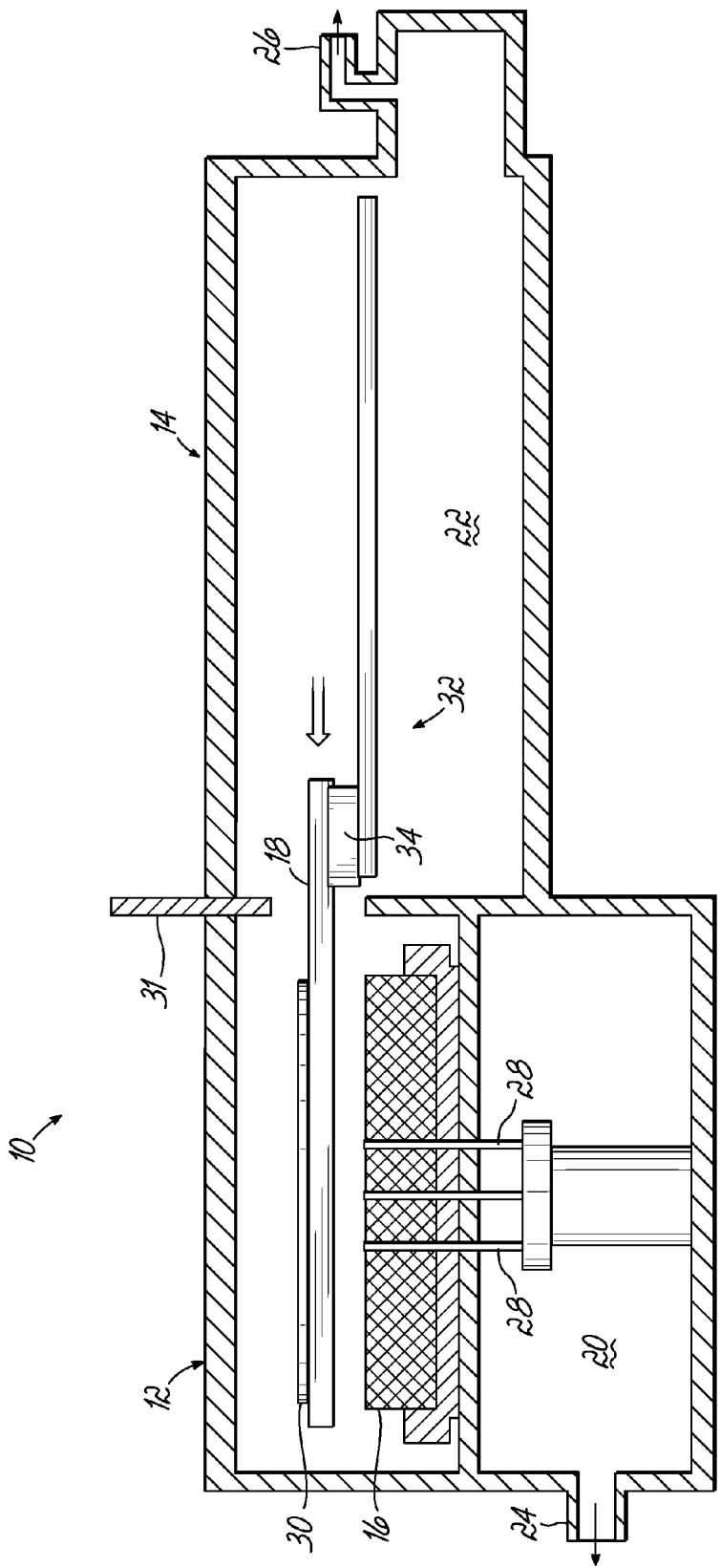

The system 10 of FIGS. 1A and 1B includes a dedicated transfer mechanism 32 positioned within the cooling chamber 14 and having a transfer arm 34 configured to transfer the wafer 30 between a home position within the cooling chamber 14, as shown in FIG. 1A and a transfer position above the heating plate 16, as shown in FIG. 1A. In this way, the wafer 30 may be transferred between the heating plate 16 and the chilling plate 18 as necessary and in accordance with a particular processing method. More specifically, the wafer 30 supported by the heating plate 16 may be heated and then lifted, via lift pins 28, off the heating plate 16. The movable door 31 may be repositioned provide an opening between the heating and cooling chambers 12, 14 to permit entry of the chilling plate 18 into the heating chamber 12. The transfer arm 34 moves the chilling plate 18 the transfer position such that the lift pin 28 may lower the wafer 30 onto the chilling plate 18. Thereafter, the transfer arm 34 withdraws the chilling plate 18 with the wafer 30 to the home position so the wafer 30 may be cooled. Although the illustrated cooling system 14 is shown with a chilling plate 18, the cooling chamber 14 may comprise at least one of a wafer chuck configured in fluid communication with a chiller unit, a thermoelectric device, or a gas inlet in fluid communication with a convective gas supply.

The system 10 may also include one or more feedback control mechanisms (not shown), such as analyzers, sensors, and controllers that monitor and adjust the atmospheres in the heating chamber, cooling chamber, and/or transfer area. For example, the feedback control mechanisms may be capable of making real-time adjustments with respect to temperature, oxygen levels, and/or pressure.

The wafer 30 may include a substrate having bottom and top hard resist layers formed thereon. While the terms "top" and "bottom" may be generally arbitrarily set, as used herein, the top of a wafer 30 is the side that is being processed or that is facing the deposition apparatus. In a preliminary step of one embodiment, a photoresist layer is deposited onto the top hard resist layer, patterned, and developed to provide guiding layers in a grapho-epitaxy and/or chemi-epitaxy DSA process. In that regard, the photoresist layer may be masked, imaged, developed, and processed in accordance with conventional procedures.

While FIGS. 1A and 1B depict a traditional single wafer process embodiment, the present invention is not limited thereto. In that regard, batch processing utilizing a multi-chambered furnace, along with suitable transfer mechanism is further contemplated.

Figure 2:
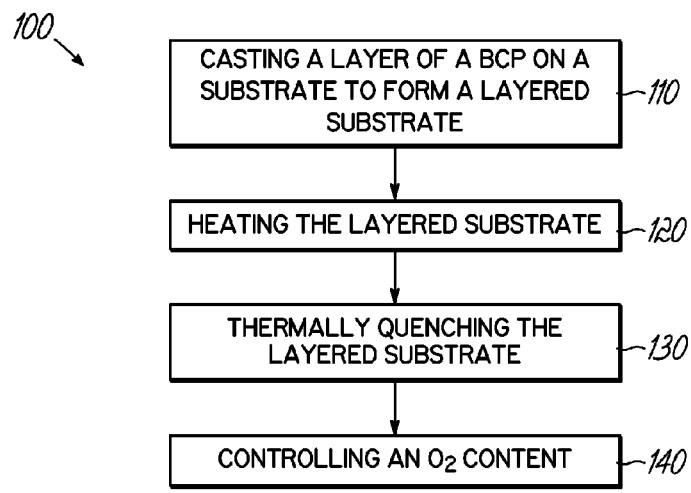
FIG. 2 is a flow chart illustrating a method of forming a patterned substrate, in accordance with an embodiment of the present invention.

With reference now to FIG. 2, a flow chart 100 illustrating a method of processing the wafer 30 according to one embodiment of the present invention is described. In step 110, a layer of block copolymer (BCP) is cast onto the substrate to form a layered substrate. The BCP has an intrinsic glass transition temperature $T_g$, as well as a thermal degradation temperature $(T_d)$ that is dependent upon its environmental conditions. The BCP layer includes first and second polymer blocks, which can under a thermodynamic microphase separation to form a first and a second domain. The lengths of each of the blocks making up the first and second polymer block may intrinsically limit the sizes of the first and second domains. For example, the first and second block copolymers may be chosen with a sufficient length to facilitate self-assembly into the desired pattern of domains because shorter copolymers may not self-assemble as desired. Exemplary first block copolymers may include, but are not limited to, poly(9,9-bis(6'-N,N,N-trimethylammonium)-hexyl)-fluorenephenylene) ("PFP"), poly(4-vinylpyridine) ("4PVP"), hydroxypropyl methylcellulose ("HPMC"), polyethylene glycol ("PEG"), poly(ethylene oxide)-co-poly(propylene oxide) di- or multiblock copolymers, poly(vinyl alcohol) ("PVA"), poly(ethylene-co-vinyl alcohol) ("PEVA"), poly (acrylic acid) ("PAA"), poly(ethyloxazoline), poly(alkylacrylate), polyacrylamide, poly(N-alkylacrylamide), poly (N,N-dialkylacrylamide), poly(propylene glycol) ("PPG"), poly(propylene oxide) ("PPO"), partially or fully hydrolyzed poly(vinyl alcohol), dextran, polystyrene ("PS"), polyethylene ("PE"), polypropylene ("PP"), polychloroprene ("CR"), polyvinyl ether ("PVE"), poly(vinyl acetate) ("PVAc"), poly (vinyl chloride) ("PVC"), polyurethane ("PU"), and polyacrylate. Exemplary second block copolymers may include, but are not limited to, silicon-containing polymers such as a polysiloxane (e.g., polydimethylsiloxane ("PDMS")) or silicon- and iron-containing polymers (e.g., poly(ferrocenyldimethylsilane) ("PFS")). Thus, exemplary block copolymers may include polystyrene-b-polydimethylsiloxane ("PS-PDMS"), poly(2-vinylpyridine-b-dimethylsiloxane ("P2VP-PDMS"), or polystyrene-b-poly(ferrocenyldimethylsilane) ("PS-PFS"). Modifications of the block copolymers is also envisaged, such as that disclosed in U.S. Patent Application Serial No. 2012/0046415, entitled METHODS OF FORMING BLOCK COPOLYMERS, METHODS OF FORMING A SELF-ASSEMBLED BLOCK COPOLYMER STRUCTURE AND RELATED COMPOSITIONS, the disclosure of which is incorporated herein by reference, in its entirety.

Referring still to FIG. 2, in step 120, the layered substrate is heated at an annealing temperature in a heating atmosphere for a period of time. In the annealing step 120, the layered substrate is heated to a temperature sufficient to allow the BCP to self-organize into first and second domains, each of which is characterized by its respective polymer block. This copolymer microphase separation drives lithography CD and pitch control.

Annealing of BCP's is a thermodynamic phenomenon that can be accelerated by a kinetic process. Accordingly, by raising the annealing temperature very high above the intrinsic glass transition temperature $T_g$, less time is required for the annealing step 120. In accordance with an embodiment, the annealing temperature may be greater than about 50° C. above the intrinsic glass transition temperature $T_g$ of the block copolymer. The annealing temperature may be in the range of 100-400° C. With respect to a PS-PDMS block copolymer, for example, the annealing temperature may be 340° C. In accordance with an embodiment, the layered substrate may be heated in a furnace, which is adapted and designed for batch processing, or heated in an oven, which is adapted and designed for single wafer processing. The period of time may comprise a time in the range of 2 minutes to more than 4 hours.

According to embodiments of the present invention, the ambient oxygen content of the annealing (heating) atmosphere may be equal to or less than about 50 ppm. For example, the ambient oxygen content may be equal to or less than: about 45 ppm, about 40 ppm, about 35 ppm, about 30 ppm, about 25 ppm, about 20 ppm, about 15 ppm, about 10 ppm, about 8 ppm, or about 5 ppm; or the ambient oxygen content may be maintained at a level that is equal to or within a range between each possible combination thereof. Exemplary ranges include, but are not limited to, about 45 ppm to about 5 ppm, about 40 ppm to about 8 ppm, about 35 ppm to about 10 ppm, about 30 ppm to about 15 ppm, about 25 to about 20 ppm, or about 30 ppm to about 20 ppm.

In step 130, the layered substrate is thermally quenched in a quenching atmosphere to a quenching temperature that is less than the intrinsic glass transition temperature $T_g$. The cooling atmosphere may be held at room temperature, for example. The quenching rapidly lowers a temperature of the layered substrate from the annealing temperature to the quenching temperature. By quickly reducing the kinetic movement of the polymer blocks, the CD is controlled or "locked in," which enables better CD control targeting and lowers defects. When the layered substrate is annealed at a high temperature, rapid quenching is important because the CD and pitch of the BCP continue to change as long as the temperature of the layered substrate is above the intrinsic glass transition temperature $T_g$.

According to embodiments of the present invention, the ambient oxygen content of the quenching (cooling) environment may be equal to or less than about 50 ppm. For example, the ambient oxygen content may be equal to or less than: about 45 ppm, about 40 ppm, about 35 ppm, about 30 ppm, about 25 ppm, about 20 ppm, about 15 ppm, about 10 ppm, about 8 ppm, or about 5 ppm; or the ambient oxygen content may be equal to or within a range between each possible combination thereof. Exemplary ranges include, but are not limited to, about 45 ppm to about 5 ppm, about 40 ppm to about 8 ppm, about 35 ppm to about 10 ppm, about 30 ppm to about 15 ppm, about 25 to about 20 ppm, or about 30 ppm to about 20 ppm.

Figure 3:
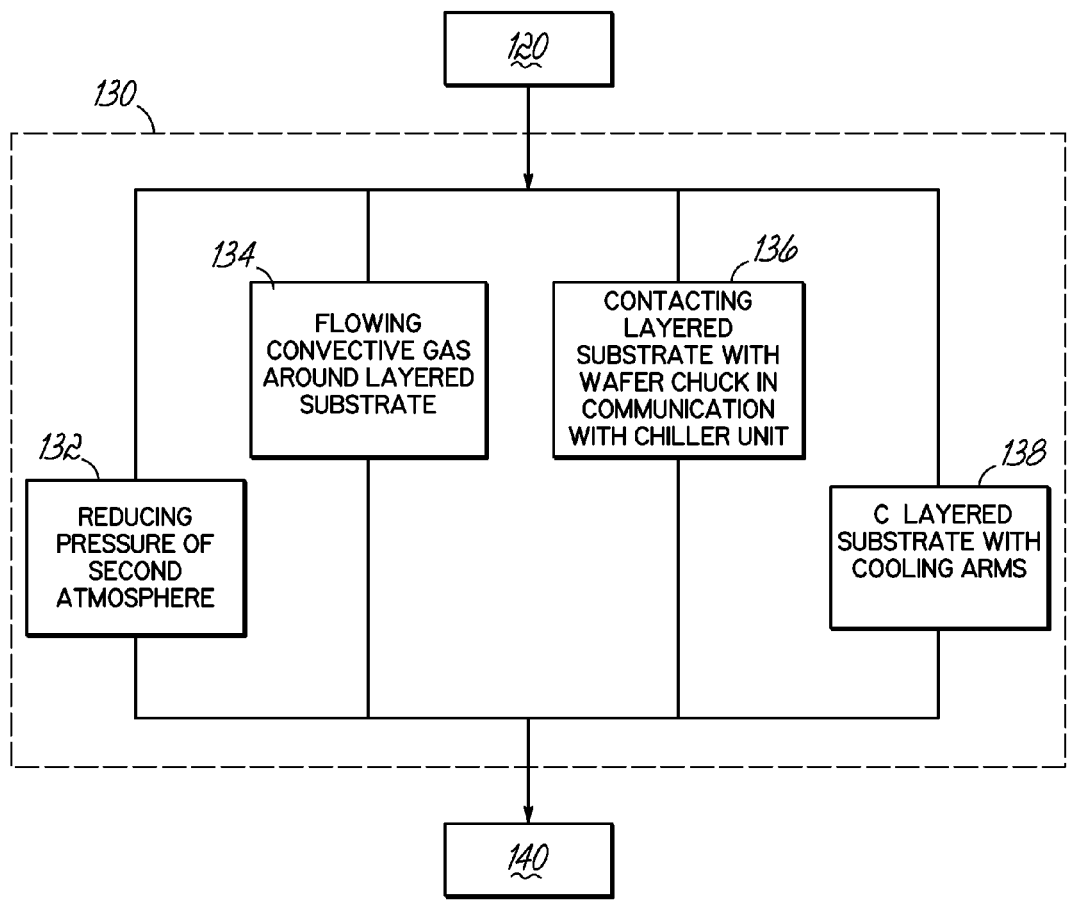
FIG. 3 a flow chart illustrating methods of thermally quenching the layered substrate, in accordance with an embodiment of the present invention.

According to embodiments of the present invention, thermally quenching the annealed layered substrate may be performed in several manners. For example, as shown in FIG. 3, the thermal quenching may comprise at least one of reducing a pressure of the second atmosphere (step 132), flowing convective gas around the layered substrate (step 134), contacting the layered substrate with a wafer chuck in communication with a chiller unit (step 136), and/or contacting the layered substrate with cooling arms (step 138). With respect to step 134, the convective gas may comprise nitrogen, argon, or helium, for example. The quenching may also comprise use of a thermoelectric Peltier device. The quenching step 130 may occur over a duration of time equal to or less than approximately 1-5 minutes and/or at a rate greater than or equal to 50° C./minute. With the example of PS-PDMS, the layered substrate may be quenched from a temperature of 340° C. to a temperature of 250° C. in 1 minute (i.e., at a rate of 90° C./minute). The quenching atmosphere may comprise a cooling chamber 14, specifically a cooling Front Opening Unified Pod (FOUP), a wafer boat, or a wafer handler, pod, for example.

In an embodiment in which the heating atmosphere comprises a heating chamber 12 and the quenching atmosphere comprises a cooling chamber 14, one or more lots of layered substrates may be processed simultaneously. The layered substrates may be transferred to the heating chamber 12 prior to heating the layered substrate at the annealing temperature and may be transferred to the cooling chamber 14 prior to thermally quenching. The transferring may be achieved with use of the transfer mechanism 32. By processing the layered substrates in multiple chambers, it is not necessary to wait for a single chamber to transition between a very high annealing temperature and the quenching temperature. Particularly as a result a large thermal mass inside the chamber during the processing of a batch of wafers, it takes a long time to transition between the annealing and quenching temperatures.

Use of separate heating and cooling chambers 12, 14 is efficient and enables the system 10 to maintain a high throughput. For example, layered substrates can bake in the heating chamber 12 for 60 minutes, and then proceed to the cooling chamber 14 for 30 minutes. New layered substrates may be moved into the heating chamber 12 immediately after the first lot(s) is removed to the cooling chamber 14. Therefore, productivity may be maintained without requiring time to directly heat and cool a single chamber.

In another embodiment, a single layered substrate may be positioned on a track in an oven during the heating step. Moreover, the layered substrate may be transferred from the track to the cooling chamber 14, comprising, for example, a chill plate or an oven, prior to thermally quenching. In this embodiment, the cooling chamber 14 may include at least one of a wafer chuck configured in fluid communication with a chiller unit; a convective blanket of nitrogen, argon, or helium, for example; or cooling arms. The cooling arms may be employed in a nitrogen buffer chamber.

According to one aspect of the present invention, the oxygen content of the processing environments can be controlled to minimize thermal degradation of the BCP at elevated temperatures. Returning now to FIG. 2, in a step 140, an oxygen content in the annealing and quenching atmospheres is controlled to a level that is less than or equal to about 5 ppm to about 8 ppm so as to maintain the annealing temperature and the quenching temperature below a thermal degradation temperature $T_d$ of the BCP. For the example of PS-PDMS, an oxygen level of less than 5 ppm may be required. When layered substrates are annealed at high temperatures, the polymers may oxidize, which causes CD defects. Therefore, maintaining a low oxygen environment helps prevent such oxidation and helps to lock in the CD and pitch. In an embodiment, the low oxygen environment is maintained even while the layered substrate is transferred between the chambers. After a temperature of the layered substrate is below the oxidation level of the polymer, the wafer may be transferred to atmospheric conditions, such as in a wafer FOUP.

Figure 4:
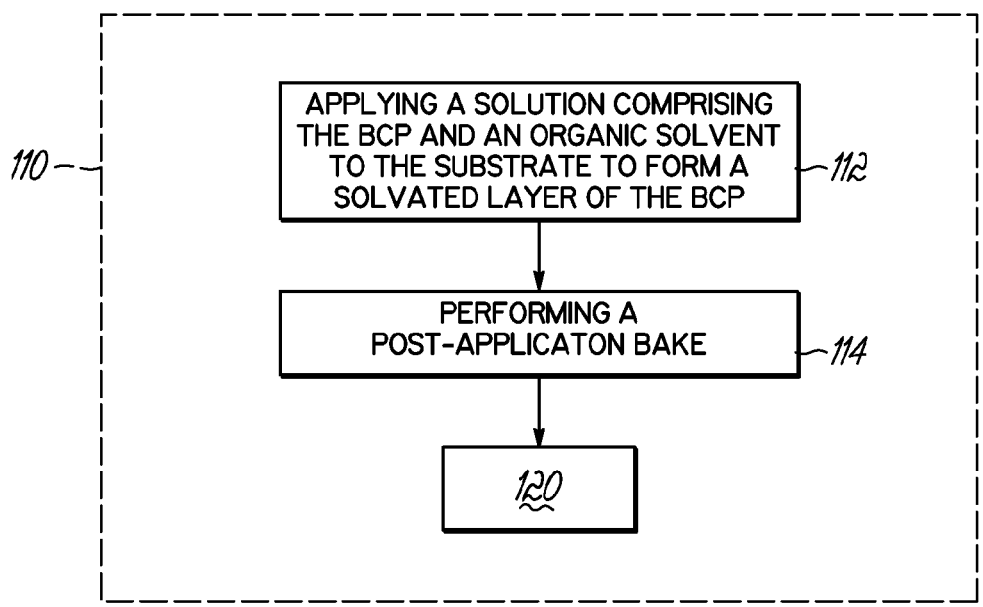
FIG. 4 is a flow chart illustrating a method of casting a layer of block copolymer on a substrate, in accordance with an embodiment of the present invention.

With reference to FIG. 4, in an embodiment in which the heating chamber comprises a furnace, the casting step 110 may include applying a solution comprising the block copolymer and an organic solvent to the substrate to form a solvated layer of the block copolymer (step 112). The casting step 110 may further include performing a post-application bake of the layered substrate to reduce an amount of the organic solvent in the solvated layer (step 114) prior to heating the layered substrate at the annealing temperature. A temperature of the post-application baking is lower than the intrinsic glass transition temperature $T_g$. The post-application bake may be performed at a temperature of approximately 110° C., for example. The post-application bake helps to reduce the amount of casting solvent that enters the furnace and, thus, helps prevent organic build-up in the furnace. The post-application bake may be performed on a track, and the exhaust may be pumped down outside the system 10.

Figure 5:
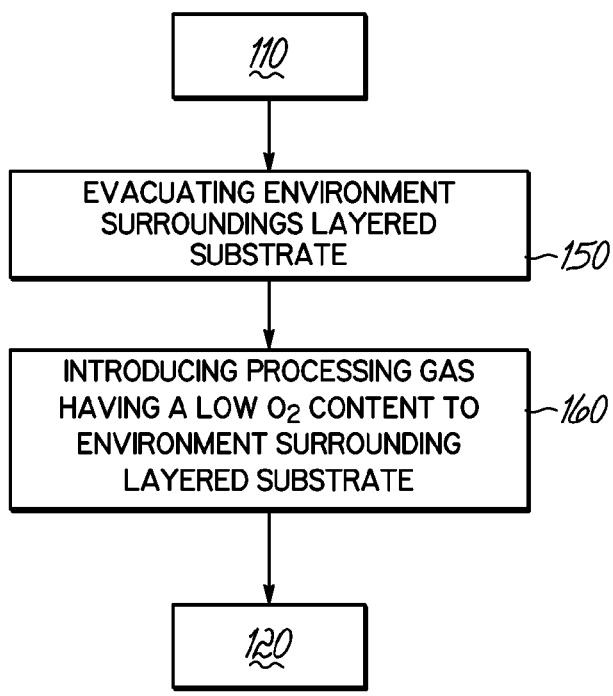
FIG. 5 is a flow chart illustrating a method of providing a low oxygen environment to the layered substrate prior to annealing the layer of block copolymer.

With reference now to FIG. 5, in an embodiment in which a single wafer is processed in an oven, the method 100 may comprise an additional step 150 of evacuating an environment surrounding the layered substrate to a pressure equal to or less than 100 torr prior to the annealing 120 of the layered substrate. The evacuation may be accomplished with use of a vacuum pump, and the resulting change in pressure may lead to a temperature decrease in the oven.

The method 100 may further comprise the optional step 160 of introducing a processing gas having an oxygen content equal to or less than about 8 ppm to the environment surrounding the layered substrate to provide the heating atmosphere, wherein the introducing the processing gas is performed after the evacuating step 150 and prior to the annealing step 120. The processing gas may comprise an organic solvent in a gaseous phase to provide a content of the organic solvent in the first atmosphere at a level equal to or greater than about 100 torr, thereby defining a solvent-rich environment.

After the annealing step 120 and the quenching step 130, the layered substrate may be maintained at a temperature below the intrinsic glass transition temperature $T_g$, while concurrently lowering the organic solvent content in the environment surrounding the layered substrate. This lowering of the organic solvent content may be accomplished by transferring the layered substrate to a post-application bake plate for a bake at a temperature below the intrinsic glass transition temperature $T_g$. This baking may help to remove an amount of residual solvent. The baking temperature should be low enough so that solvent is removed slowly, which helps to minimize polymer cracking and/or delamination of the layered substrate.

While the present invention has been illustrated by a description of one or more embodiments thereof and while these embodiments have been described in considerable detail, they are intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of forming a patterned substrate, comprising:
   casting a layer of a block copolymer on a substrate to form a layered substrate, wherein the block copolymer is polystyrene-b-polydimethylsiloxane, polystyrene-b-poly(ferrocenyldimethylsilane), or poly(2-vinylpyridine)-b-polydimethylsiloxane, and wherein the block copolymer has an intrinsic glass transition temperature $T_g$;
   heating the layered substrate at an annealing temperature in a first atmosphere for a first time period, wherein the annealing temperature is greater than about 50° C. above the intrinsic glass transition temperature $T_g$ of the block copolymer;
   thermally quenching the layered substrate to a quenching temperature at a rate of greater than about 50° C./minute in a second atmosphere, wherein the quenching temperature is lower than the intrinsic glass transition temperature $T_g$; and
   controlling an oxygen content in the first and second atmospheres to a level equal to or less than about 50 ppm to maintain the annealing temperature and the quenching temperature below a thermal degradation temperature $T_d$ of the block copolymer.

2. The method of claim 1, wherein thermally quenching comprises:
   reducing a pressure of the second atmosphere;
   flowing a convective gas around the layered substrate;
   contacting the layered substrate with a wafer chuck configured in fluid communication with a chiller unit;
   contacting the layered substrate with cooling arms; or
   combinations thereof.

3. The method of claim 2, wherein the thermally quenching comprises flowing a convective gas comprising nitrogen.

4. The method of claim 1, wherein the thermally quenching lowers a temperature of the layered substrate from the annealing temperature to the quenching temperature over a duration of time equal to or less than about 5 minutes.

5. The method of claim 1, wherein the oxygen content is less than about 30 ppm of oxygen.

6. The method of claim 1, wherein the first atmosphere is defined by a heating chamber and the second atmosphere is defined by a cooling chamber, the method further comprising:
   transferring the layered substrate to the heating chamber prior to heating the layered substrate at the annealing temperature; and
   transferring the layered substrate to the cooling chamber prior to thermally quenching.

7. The method of claim 6, wherein the cooling chamber comprises at least one of a wafer chuck configured in fluid communication with a chiller unit, a thermoelectric device, or a gas inlet in fluid communication with a convective gas supply.

8. The method of claim 6, wherein the cooling chamber comprises a cooling front opening unified pod, a wafer boat, or a wafer handler pod.

9. The method of claim 1, wherein the casting of the layer of the block copolymer comprises:
   applying a solution comprising the block copolymer and an organic solvent to the substrate to form a solvated layer of the block copolymer; and
   performing a post-application bake to reduce an amount of the organic solvent in the solvated layer prior to heating the layered substrate at the annealing temperature.

10. The method of claim 9, wherein performing the post-application bake is performed on a track.

11. The method of claim 9, further comprising transferring the layered substrate to a furnace prior to heating the layered substrate at the annealing temperature.

12. The method of claim 1, wherein the heating the layered substrate occurs on a track in an oven, the method further comprising:

transferring the layered substrate from the track to a cooling chamber prior to thermally quenching.

13. The method of claim 12, wherein the cooling chamber comprises at least one of a wafer chuck configured in fluid communication with a chiller unit, a nitrogen blanket, or cooling arm.

14. The method of claim 1, further comprising:
evacuating an environment surrounding the layered substrate to a pressure equal to or less than 100 ton prior to the heating the layered substrate at the annealing temperature; and
optionally introducing a processing gas having an oxygen content equal to or less than about 50 ppm to the environment surrounding the layered substrate to provide the first atmosphere having an oxygen content equal to or less than about 50 ppm, wherein the introducing the processing gas is performed after the evacuating and prior to the heating the layered substrate at the annealing temperature.

15. The method of claim 14, wherein the processing gas comprises an organic solvent in a gaseous phase to provide a partial pressure of the organic solvent in the first atmosphere at a level equal to or greater than about 100 torr thereby defining a solvent-rich environment.

16. The method of claim 15, further comprising:
maintaining the layered substrate at a temperature below the intrinsic glass transition temperature $T_g$ after thermally quenching, while concurrently lowering the organic solvent content in the environment surrounding the layered substrate.

17. The method of claim 16, further comprising:
transferring the layered substrate to a post application bake plate; and
baking the layered substrate at the temperature below the intrinsic glass transition temperature $T_g$, wherein the baking removes an amount of the organic solvent from the layered substrate.

18. The method of claim 1, wherein the first time period is less than about four hours.

19. The method of claim 1, wherein the first time period is about one hour.

20. The method of claim 1, wherein the block copolymer is polystyrene-b-polydimethylsiloxane, and the annealing temperature is 340° C.

\* \* \* \* \*

UNITED STATES PATENT AND TRADEMARK OFFICE
CERTIFICATE OF CORRECTION

| | |
|---|---|
| PATENT NO. | : 9,209,014 B2 |
| APPLICATION NO. | : 14/202689 |
| DATED | : December 8, 2015 |
| INVENTOR(S) | : Rathsack |

Page 1 of 1

It is certified that error appears in the above-identified patent and that said Letters Patent is hereby corrected as shown below:

In the Claims:

Col. 11, line 9, Claim 14, "equal to or less than 100 ton" should read --equal to or less than 100 torr--.

Signed and Sealed this
Twenty-ninth Day of March, 2016

Michelle K. Lee
*Director of the United States Patent and Trademark Office*